(12) United States Patent
Suzuki

(10) Patent No.: US 8,652,965 B2
(45) Date of Patent: Feb. 18, 2014

(54) PRODUCTION METHOD FOR THICK FILM METAL ELECTRODE AND PRODUCTION METHOD FOR THICK FILM RESIST

(75) Inventor: Kenji Suzuki, Chichibu (JP)

(73) Assignee: Showa Denko K.K., Tokyo (JP)

( * ) Notice: Subject to any disclaimer, the term of this patent is extended or adjusted under 35 U.S.C. 154(b) by 153 days.

(21) Appl. No.: 13/416,207

(22) Filed: Mar. 9, 2012

(65) Prior Publication Data

US 2012/0238090 A1     Sep. 20, 2012

(30) Foreign Application Priority Data

Mar. 14, 2011   (JP) .................................. 2011-055243

(51) Int. Cl.
    *H01L 21/44*     (2006.01)
(52) U.S. Cl.
    USPC ........... 438/670; 438/671; 438/780; 438/781; 438/950; 438/951; 430/270.1; 430/326; 257/680; 257/E21.159; 257/E21.346
(58) Field of Classification Search
    None
    See application file for complete search history.

(56) References Cited

U.S. PATENT DOCUMENTS

| | | | | |
|---|---|---|---|---|
| 5,591,654 A | * | 1/1997 | Kishimura | .................... 438/526 |
| 6,329,125 B2 | * | 12/2001 | Takechi et al. | ................ 430/326 |
| 8,110,333 B2 | * | 2/2012 | Kamimura et al. | ......... 430/270.1 |
| 8,507,174 B2 | * | 8/2013 | Takahashi et al. | ......... 430/270.1 |
| 8,507,176 B2 | * | 8/2013 | Thackeray et al. | ......... 430/270.1 |
| 2011/0183258 A1 | * | 7/2011 | Takahashi et al. | ......... 430/270.1 |

FOREIGN PATENT DOCUMENTS

JP     2003-243323 A     8/2003

* cited by examiner

*Primary Examiner* — Zandra Smith
*Assistant Examiner* — Khanh Duong
(74) *Attorney, Agent, or Firm* — Sughrue Mion, PLLC

(57) ABSTRACT

One object of the present invention is to provide a method for producing a thick film metal electrode that is able to form a positive-negative reverse type resist, which has a thickness of 7 μm or more and excellent in-plane uniformity, on the circuit element formed on the silicon carbide substrate, and a method for producing a thick film resist, and the present invention provides a method for producing a thick film resist wherein a first positive-negative reverse type resist having a first viscosity is formed on an upper surface of a circuit element layer which is treated with HMDS, and a second positive-negative reverse type resist having a second viscosity, which is larger than the first viscosity, on the first positive-negative reverse type resist such that a total thickness of the first and second positive-negative reverse type resists constituting a thick film resist be 7 μm or more.

15 Claims, 10 Drawing Sheets

HEAT

PRODUCTION METHOD FOR THICK FILM METAL ELECTRODE AND PRODUCTION METHOD FOR THICK FILM RESIST

CROSS-REFERENCE TO RELATED APPLICATIONS

This application is based on Japanese Patent Application No. 2011-055243 filed in Japan on Mar. 14, 2011, the content of which is incorporated herein by reference.

TECHNICAL FIELD

The present invention relates to a method for producing a thick film metal electrode and a method for producing a thick film resist.

BACKGROUND ART

Silicon carbide (SiC) is one type of semiconductor material, and has a larger band gap compared with other semiconductor materials, such as silicon (Si) and gallium arsenide (GaAs). Therefore, investigation for producing silicon carbide devices using a silicon carbide substrate, such as power devices, high frequency devices, devices operating at high temperatures has been conducted, as shown in Japanese Unexamined Patent Application First Publication No. 2003-243323.

The power device having a silicon carbide substrate includes a silicon carbide substrate, a circuit element which has a power device element and is formed on the silicon carbide substrate, and an electrode pad which is formed on the circuit element and electrically connected with the power device.

The electrode pad has a fine shape. Therefore, the electrode pad has been produced by a lift-off method that is able to form a fine metal pattern.

Specifically, the electrode pad is formed on the circuit element by depositing a metal film which becomes a base material of the electrode pad from the upper side of a resist having an opening exposing a surface of the circuit element layer at which the electrode pad will be formed, and then lifting the resist having the metal film off the circuit element layer. When the electrode pad is formed by this method, it is necessary to form the opening such that the sectional form of the opening be an inverse tapered shape. Therefore, it is preferable that the resist used in the lift-off method be a positive-negative reverse type resist.

On the other hand, when the power device is produced using the electrode pad, in order to electronically connect between a wiring substrate and the power device, the electrode pad is connected with a metal wire by a wire bonding method. Due to this fact, the electrode pad has to have a thickness sufficient to have excellent mechanical strength.

In addition, since a high current flows through the electrode pad constituting the power device, the power device is easily heated. Therefore, it is necessary to radiate heat of the power device through the electrode pad. In other words, it is necessary to use the electrode pad as a heat radiator.

Based on these reasons, it is necessary to adjust the thickness of the electrode pad in the silicon carbide device having a silicon carbide plate to 6 µm or more.

However, when a commercial positive-negative reverse type resist is used, the maximum thickness of the film formed at a time is about 6 µm at the present time. Therefore, the thickness of the electrode pad, which can be formed by the lift-off method using a commercial positive-negative reverse type resist, is about 5 µm. Due to this fact, it is impossible to produce the electrode pad having a thickness of 6 µm or more by a conventional production method.

Moreover, it can be thought that the thickness of the positive-negative reverse type resist can be 7 µm or more by laminating twice the positive-negative reverse type resist having the same properties. In this case, it is impossible to adjust the in-plane irregularity (non-uniformity on the surface of the silicon carbide substrate) on the surface of the formed positive-negative reverse type resist to a desired range (for example, when the outer circumference of the silicon carbide substrate having a diameter of 3 inches is cut such that the cutting width be 5 mm (edge cutting at 5 mm), the variation of the thickness of the resist formed on the residual center silicon carbide substrate is 5% or less).

That is, it is impossible to produce the electrode pad which has a thickness of 6 µm or more and an excellent shape on the surface of the silicon carbide substrate. Specifically, it is impossible to produce the electrode pad having a thickness of 6 µm or more and having no burring on the edge.

The present invention has been accomplished in view of the foregoing, and an object of the present invention is to provide a method for producing a thick film metal electrode that is able to form a positive-negative reverse type resist, which has a thickness of 7 µm or more and excellent in-plane uniformity, on the circuit element formed on the silicon carbide substrate, and a method for producing a thick film resist.

In other words, the present invention provides the following solutions.

(1) A method for producing a thick film metal electrode having a thickness of 6 µm or more on an upper surface of a circuit element layer formed on a silicon carbide substrate including:

a step of treating the upper surface of the circuit element layer with hexamethyldisilazane;

a step of forming a first positive-negative reverse type resist having a first viscosity on the upper surface of the circuit element layer which is treated with hexamethyldisilazane;

a step of forming a second positive-negative reverse type resist having a second viscosity, which is larger than the first viscosity, on the first positive-negative reverse type resist such that a total thickness of the first and second positive-negative reverse type resists be 7 µm or more;

a step of exposing the first and second positive-negative reverse type resists through a mask for exposure including a shading part facing an electrode formation area at which the thick film metal electrode is formed;

a step of baking the first and second positive-negative reverse type resists to reverse positive properties of the first and second positive-negative reverse type resists to negative properties, after the exposing;

a step of exposing the whole first and second positive-negative reverse type resists after the baking;

a step of developing the first and second positive-negative reverse type resists to form an opening, which has a sectional form having an inverse tapered shape and exposes the electrode formation area, after the exposing step for the whole first and second positive-negative reverse type resists;

a step of post-baking the first and second positive-negative reverse type resists after forming the opening;

a step of forming a metal film having a thickness of 6 µm or more, which is a base material for the thick film metal electrode by a vapor deposition method from the upper side of the second positive-negative reverse type resist, after the post-baking; and a step of lifting the first and second positive-negative reverse type resists off.

(2) The method for producing a thick film metal electrode according to (1), wherein the first viscosity is 30 cp or less, and the second viscosity is 80 cp or more.

(3) The method for producing a thick film metal electrode according to (1) or (2), wherein the thick film metal electrode is an electrode for external connection to be connected with a metal wire by a wire bonding method.

(4) The method for producing a thick film metal electrode according to any one of (1) to (3), wherein the circuit element layer includes a power device, and the power device is electrically connected with the thick film metal electrode.

(5) The method for producing a thick film metal electrode according to any one of (1) to (4), wherein the step of forming a first positive-negative reverse type resist includes a step of forming the first positive-negative reverse type resist in a liquid state on the upper surface of the circuit element layer, which is treated with hexamethyldisilazane; and a step of pre-baking the first positive-negative reverse type resist in a liquid state to harden the first positive-negative reverse type resist.

(6) The method for producing a thick film metal electrode according to (5), wherein the thickness of the hardened first positive-negative reverse type resist is 5 μm or less in the step of forming a first positive-negative reverse type resist.

(7) The method for producing a thick film metal electrode according to any one of (1) to (6), wherein the step of forming the second positive-negative reverse type resist includes a step of forming the second positive-negative reverse type resist in a liquid state on a hardened first positive-negative reverse type resist; and a step of pre-baking the second positive-negative reverse type resist in a liquid state to harden the second positive-negative reverse type resist.

(8) The method for producing a thick film metal electrode according to (7), wherein the thickness of the hardened second positive-negative reverse type resist is 3 μm or more in the step of forming the second positive-negative reverse type resist.

(9) A method for producing a thick film resist having a thickness of 7 μm or more on an upper surface of a circuit element layer formed on a silicon carbide substrate including:

a step of treating the upper surface of the circuit element layer with hexamethyldisilazane;

a step of forming a first positive-negative reverse type resist having a first viscosity on the upper surface of the circuit element layer which is treated with hexamethyldisilazane; and a step of forming a second positive-negative reverse type resist having a second viscosity, which is larger than the first viscosity, on the first positive-negative reverse type resist such that a total thickness of the first and second positive-negative reverse type resists be 7 μm or more.

(10) The method for producing a thick film resist according to (9), wherein the first viscosity is 30 cp or less, and the second viscosity is 80 cp or more.

(11) The method for producing a thick film resist according to (9) or (10), wherein the method further includes:

a step of exposing the first and second positive-negative reverse type resists through a mask for exposure including a shading part;

a step of baking the first and second positive-negative reverse type resists to reverse positive properties of the first and second positive-negative reverse type resists to negative properties, after the exposing;

a step of exposing the whole first and second positive-negative reverse type resists after the baking; and a step of developing the first and second positive-negative reverse type resists, after the exposing step for the whole first and second positive-negative reverse type resists.

(12) The method for producing a thick film resist according to any one of (9) or (11), wherein the step of forming a first positive-negative reverse type resist includes a step of forming the first positive-negative reverse type resist in a liquid state on the upper surface of the circuit element layer, which is treated with hexamethyldisilazane; and a step of pre-baking the first positive-negative reverse type resist in a liquid state to harden the first positive-negative reverse type resist in a liquid state.

(13) The method for producing a thick film resist according to (12), wherein the thickness of the hardened first positive-negative reverse type resist is 5 μm or less in the step of forming a first positive-negative reverse type resist.

(14) The method for producing a thick film resist according to any one of (9) to (13), wherein the step of forming the second positive-negative reverse type resist includes a step of forming the second positive-negative reverse type resist in a liquid state on a hardened first positive-negative reverse type resist; and a step of pre-baking the second positive-negative reverse type resist in a liquid state to harden the second positive-negative reverse type resist in a liquid state.

(15) The method for producing a thick film resist according to (14), wherein the thickness of the hardened second positive-negative reverse type resist is 3 μm or more in the step of forming the second positive-negative reverse type resist.

In the present invention, the first positive-negative reverse type resist having the first viscosity is formed on the upper surface of the circuit element layer which has been treated with hexamethyldisilazane (HMDS). Therefore, it is possible to produce the first positive-negative reverse type resist having a uniform thickness such as 5 μm or less.

In addition, in the present invention, the second positive-negative reverse type resist having the second viscosity, which is larger than the first viscosity, is formed on the first positive-negative reverse type resist. Therefore, it is possible to produce the second positive-negative reverse type resist having a uniform thickness such as 3 μm or more on the first positive-negative reverse type resist.

Thereby, it is possible to adjust the in-plane irregularity (non-uniformity) of the positive-negative reverse type resist, which includes the first and second positive-negative reverse type resists, and has a thickness of 7 μm or more, to a desired range (for example, when the outer circumference of the silicon carbide substrate having a diameter of 3 inches is cut such that the cutting width be 5 mm (edge cutting at 5 mm), the variation of the thickness of the positive-negative reverse type resist formed on the residual center silicon carbide substrate is 5% or less).

In addition, in the present invention, the first and second positive-negative reverse type resists are exposed through a mask for exposure including a shading part facing an electrode formation area at which the thick film metal electrode is formed, the first and second positive-negative reverse type resists are baked to reverse positive properties of the first and second positive-negative reverse type resists to negative properties, the whole first and second positive-negative reverse type resists are exposed, and then the first and second positive-negative reverse type resists are developed. Thereby, it is possible to form an opening, which has a sectional form having an inverse tapered shape and exposes the electrode formation area, in the first and second positive-negative reverse type resists (thick film resist).

Furthermore, in the present invention, after forming the opening, the first and second positive-negative reverse type resists are post-baked, the metal film having a thickness of 6 μm or more, which is a base material for the thick film metal electrode, is formed by a vapor deposition method from the upper side of the second positive-negative reverse type resist, and the first and second positive-negative reverse type resists (thick film resist) are lifted off. Thereby, it is possible to produce the thick film metal electrode which has a thickness of 6 μm or more and has excellent formability (that is, no burring at edges) in the area of the silicon carbide substrate.

The method for producing a thick film metal electrode and the method for producing a thick film resist according to the present invention are useful in producing a thick film metal electrode in a silicon carbide device including a silicon carbide substrate and a thick film resist used in forming the thick film metal electrode by a lift-off method.

MODES FOR CARRYING OUT THE INVENTION

Below, the embodiments of the present invention will be explained referring to figures.

Moreover, figures used in the following embodiments are used for explaining the construction of the embodiments according to the present invention. The size or the thickness of the elements shown in the figures may be different from the size or the thickness of the actual silicon carbide device.

FIGS. 1 to 16 are sectional views for showing the production step for the thick film metal electrode in the embodiment. In particular, FIGS. 1 to 14 are sectional views for explaining the production method for a thick film resist 27 having a thickness of 7 μm or more. FIGS. 6 to 14 show the thick film resist 27 having a thickness of 7 μm or more.

Below, the production method for a thick film metal electrode 13 (electrode pad) having a thickness of 6 μm or more is explained referring to FIGS. 1 to 16.

Figure 1:
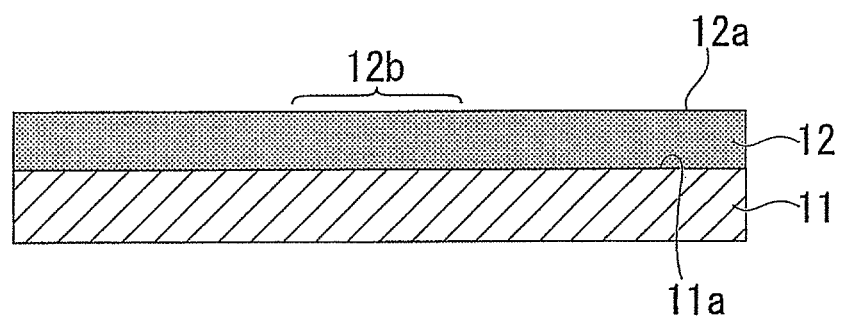
FIG. 1 is a sectional view for explaining the production step for a thick film metal electrode according to the present invention.

In the step shown in FIG. 1, a structure is prepared in which a circuit element layer 12 is formed on the surface 11a of a silicon carbide substrate 11. As the silicon carbide substrate 11, for example, a silicon carbide plate having a diameter of 3 inches can be used. In this embodiment, a silicon carbide substrate 11 having a diameter of 3 inches is used.

The circuit element layer 12 can be produced by a common method. When the silicon carbide device 10 shown in FIG. 16 is a power device, the circuit element layer 12 includes a power device element (not shown in FIG. 16).

Figure 16:
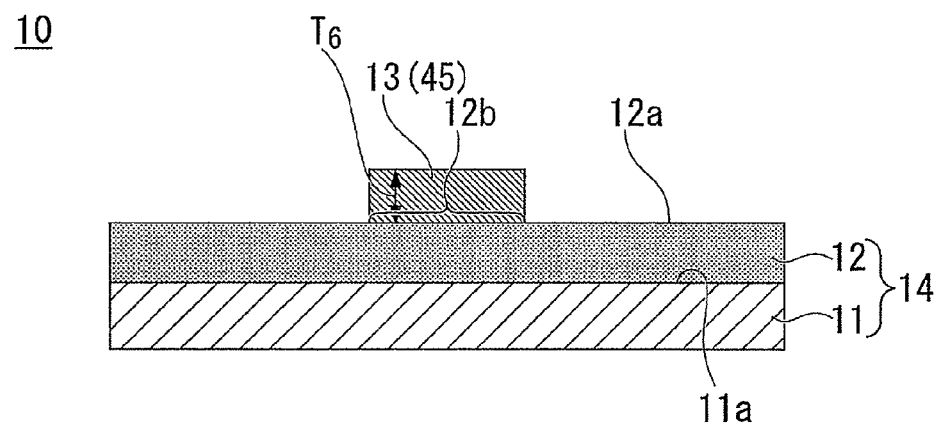
FIG. 16 is another sectional view for explaining the production step for a thick film metal electrode according to the present invention.

The upper surface 12a of the circuit element layer 12 has an electrode formation area 12b on which the thick film metal electrode 13 shown in FIG. 16 is formed. From the electrode formation area 12b, an upper surface of a conductor, which is electronically connected with the thick film metal electrode 13 shown in FIG. 16 and the power device element (not shown in figures), is exposed.

Figure 2:
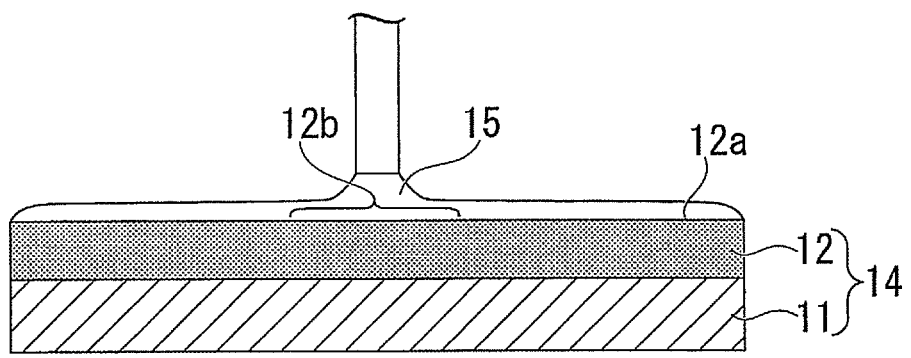
FIG. 2 is another sectional view for explaining the production step for a thick film metal electrode according to the present invention.

In the step shown in FIG. 2, the upper surface 12a including the electrode formation area 12b of the circuit element layer 12 of the structure 14 is subjected to a surface treatment using HMDS by supplying HMDS solution 15.

Due to this surface treatment, the upper surface 12a of the circuit element layer 12 is hydrophobic.

Figure 3:
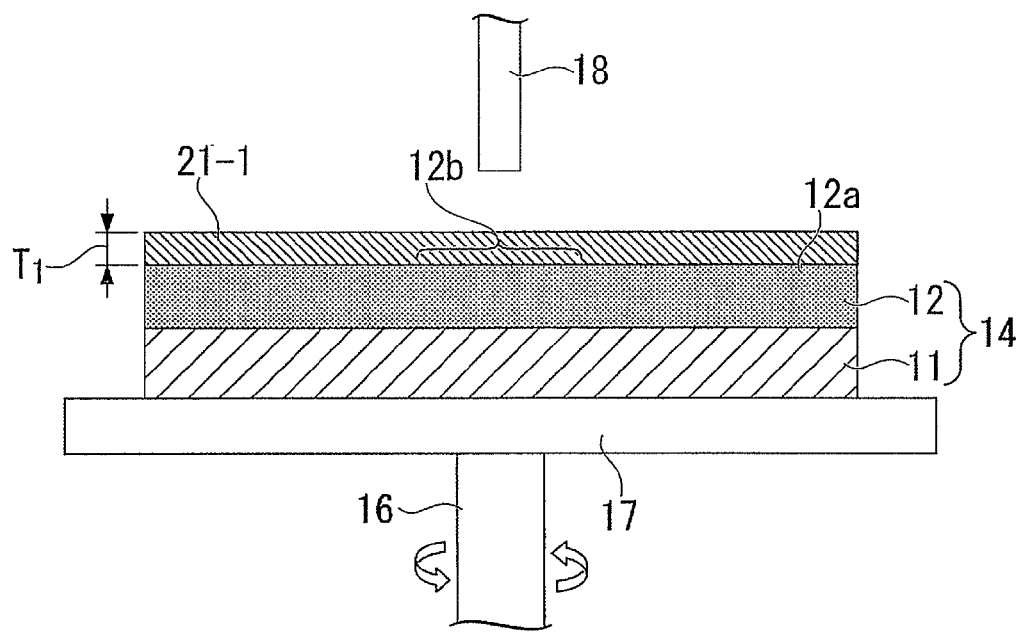
FIG. 3 is another sectional view for explaining the production step for a thick film metal electrode according to the present invention.

In the step shown in FIG. 3, the structure 14 shown in FIG. 2 is fixed (for example, by attaching) on a stage 17 having a rotation shaft 16. Then, a first positive-negative reverse type resist 21-1 having a first viscosity is dropped from a dispenser 18 toward the upper surface 12a of the circuit element layer 12, which is subjected to the surface treatment using HMDS. The first positive-negative reverse type resist 21-1 is hydrophobic and has a small first viscosity. For example, the first viscosity is preferably 30 cp or less.

Then, the structure 14 fixed on the stage 17 is rotated for a fixed time at a fixed rotation speed such as 1,200 rpm by the rotation shaft 16. Thereby, the first positive-negative reverse type resist 21-1 having a uniform thickness ($T_1$) at the whole area of the silicon carbide substrate 11 can be formed.

Figure 4:
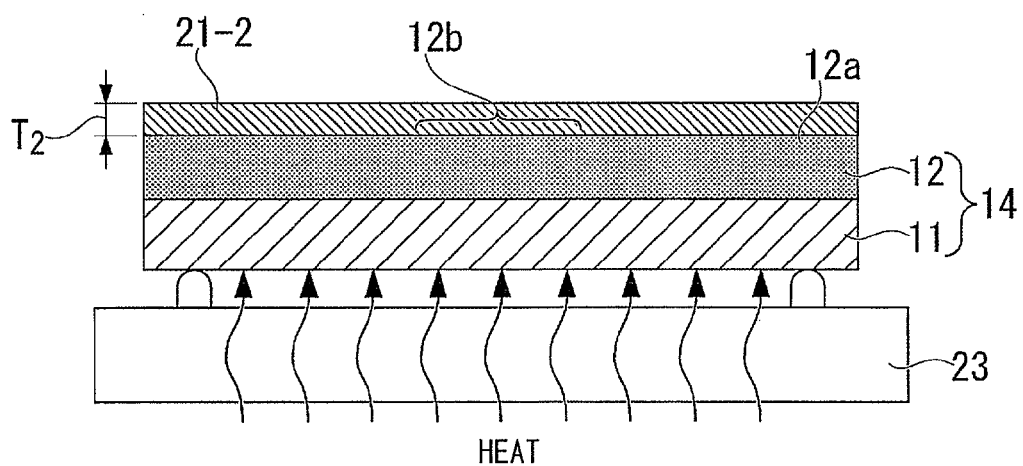
FIG. 4 is another sectional view for explaining the production step for a thick film metal electrode according to the present invention.

Moreover, the thickness ($T_1$) of the first positive-negative reverse type resist 21-1 is adjusted such that the thickness ($T_2$) of the first positive-negative reverse type resist 21-2 which is hardened by pre-baking in the subsequent step shown in FIG. 4 be 5 μm or less.

As explained above, the upper surface 12a of the circuit element layer 12 is previously treated so as to be hydrophobic. Thereby, it is possible to prevent the first positive-negative reverse type resist 21-1 having a small viscosity from flowing on the sides of the structure 14 even when the structure 14 is rotated so as to make the thickness ($T_1$) of the first positive-negative reverse type resist 21-1 uniform on the upper surface 12a after dripping the first positive-negative reverse type resist 21-1. Thereby, it is possible to form the first positive-negative reverse type resist 21 having a uniform thickness in a liquid state on the upper surface 12a of the circuit element layer 12 in the step shown in FIG. 3.

Moreover, when the thickness of the liquid first positive-negative reverse type resist 21-1 cannot be sufficiently obtained by adjusting the amount of a droplet of the liquid first positive-negative reverse type resist 21-1 supplied to the upper surface 12a and the rotation of the stage 17, the process in the step shown in FIG. 3 can be repeatedly several times.

In the step shown in FIG. 4, the structure 14 having the liquid first positive-negative reverse type resist 21-1 is arranged on a heater 23, and then, the liquid first positive-negative reverse type resist 21 is pre-baked to be hardened with heat of the heater 23. Specifically, the liquid first positive-negative reverse type resist 21 is pre-baked at a heating temperature of 100° C. and heating time of 60 seconds.

Thereby, a hardened first positive-negative reverse type resist 21-2 (abbreviated as "first positive-negative reverse type resist 21-2" below) having a thickness ($T_2$) of 5 μm can be produced. Moreover, the steps shown in FIGS. 3 and 4 are the steps of forming the first positive-negative reverse type resist 21-2.

Figure 5:
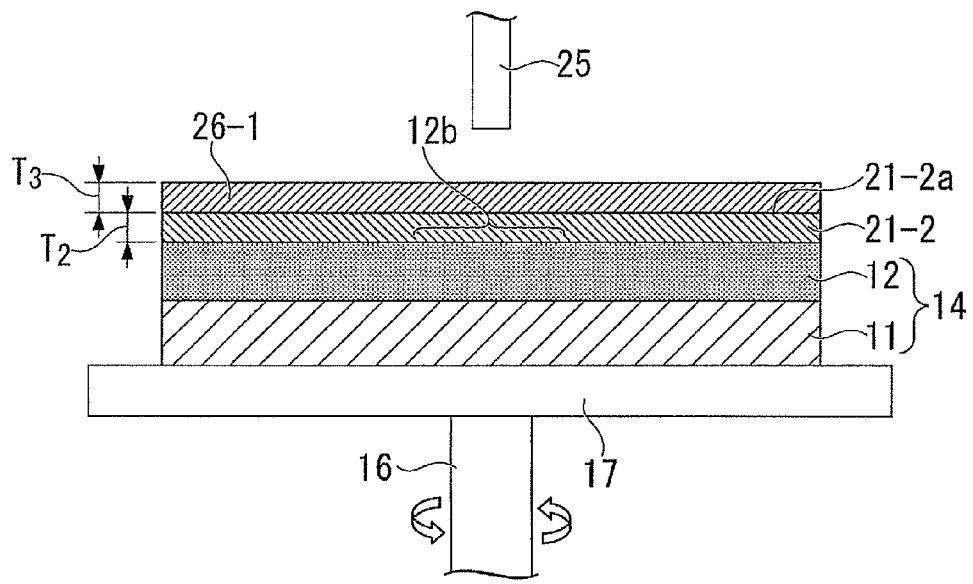
FIG. 5 is another sectional view for explaining the production step for a thick film metal electrode according to the present invention.

In the subsequent step shown in FIG. 5, the structure 14 having the first positive-negative reverse type resist 21-2 is fixed (for example, by attaching) on the stage 17 having a rotation shaft 16.

Then, a liquid second positive-negative reverse type resist 26-1 having a second viscosity, which is larger than the first viscosity of the first positive-negative reverse type resist 21-1, is dropped from a dispenser 25 toward the upper surface 21-2a of the first positive-negative reverse type resist 21-2.

The liquid second positive-negative reverse type resist 26-1 does not readily flow on the sides of the structure 14 when the structure 14 is rotated after dropping the liquid second positive-negative reverse type resist 21-6, compared with the first positive-negative reverse type resist 21-2 having the small first viscosity. When the first viscosity of the first positive-negative reverse type resist 21-1 is 30 cp or less, the second viscosity of the second positive-negative reverse type resist 26-1 is preferably 80 cp or more.

After that, the structure 14 fixed on the stage 17 is rotated for a fixed time at a fixed rotation speed such as 2,500 rpm by the rotation shaft 16. Thereby, a second positive-negative reverse type resist 26-1 having a uniform thickness ($T_3$) can be formed at the whole area of the silicon carbide substrate 11.

Figure 6:
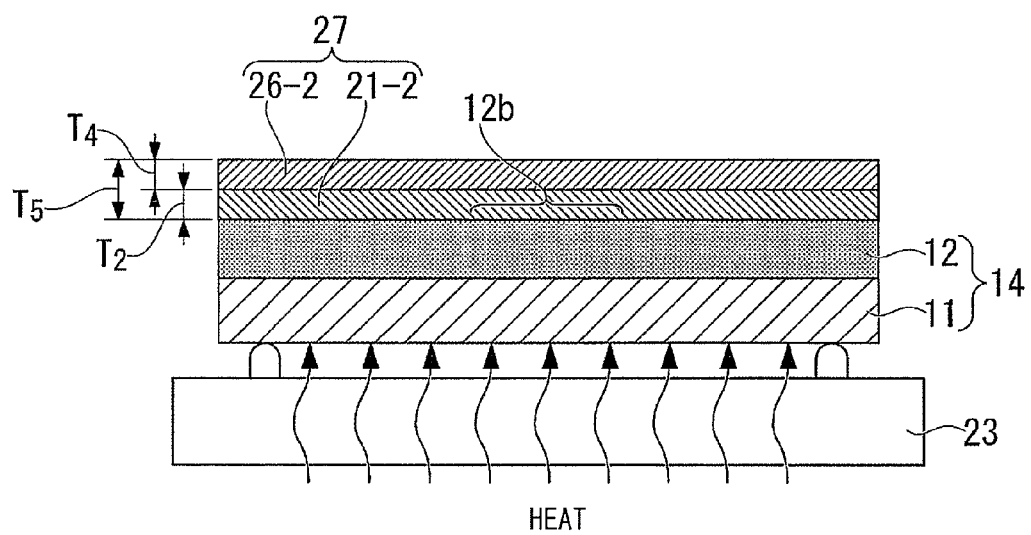
FIG. 6 is another sectional view for explaining the production step for a thick film metal electrode according to the present invention.

Moreover, the thickness ($T_3$) of the second positive-negative reverse type resist 26-1 is adjusted such that the thickness ($T_4$) of the second positive-negative reverse type resist 26-2 which is hardened by pre-baking in the subsequent step shown in FIG. 6 be 3 μm or more.

In addition, in the step shown in FIG. 5, the liquid second positive-negative reverse type resist 26-1 is formed such that the total thickness ($T_5$) of the thickness ($T_2$) of the first positive-negative reverse type resist 21-2 and the thickness ($T_4$) of the hardened second positive-negative reverse type resist 26-2 in the subsequent step shown in FIG. 6 be 7 μm or more.

In the step shown in FIG. 6, the structure 14 having the liquid second positive-negative reverse type resist 26-1 is arranged on a heater 23, and then, the liquid second positive-negative reverse type resist 26-1 is pre-baked to be hardened with heat of the heater 23. Specifically, the liquid second positive-negative reverse type resist 26-1 is pre-baked at 100° C. for 90 seconds.

Thereby, the hardened second positive-negative reverse type resist 26-2 (abbreviated as "second positive-negative reverse type resist 26-2" below) having a thickness ($T_3$) of 3 μm or more can be produced. Moreover, the steps shown in FIGS. 5 and 6 are the steps of &inning the second positive-negative reverse type resist 26-2.

In the following explanation, a positive-negative reverse type resist including the first and second positive-negative reverse type resists 21-2 and 26-2 is called "a thick film resist 27".

Figure 7:
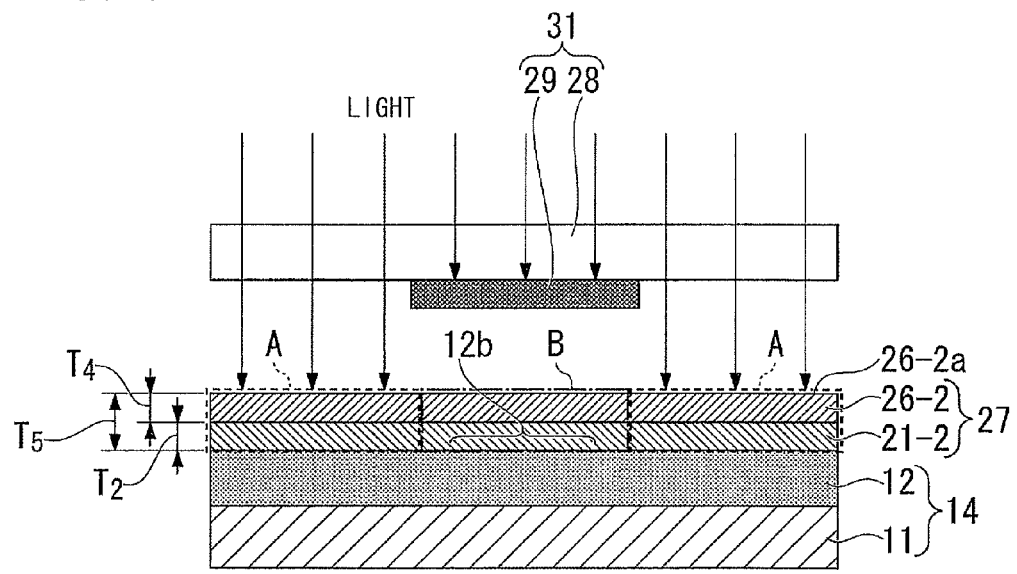
FIG. 7 is another sectional view for explaining the production step for a thick film metal electrode according to the present invention.

In the subsequent step shown in FIG. 7, the structure 14 including the thick film resist 27 (including the first and second positive-negative reverse type resists 21-2 and 26-2) is arranged on a stage in an exposure device (not shown in figures).

Then, the thick film resist 27 is exposed through a mask 31 for exposure including a transparent substrate 28, such as a glass substrate, and a shading part 29, such as a chrome mask, which is formed on the transparent substrate 28 so as to face the electrode formation area 12b.

When the thickness ($T_5$) of the thick film resist 27 is 7.5 μm, for example, the amount of exposure in the step shown in FIG. 7 is 55 mJ/cm$^2$.

At this step, the thick film resist 27 has properties as a positive type photosensitive resist. Therefore, a part of the thick film resist 27, which corresponds to an area A irradiated with light, easily dissolves in a developer. In contrast, a part of the thick film resist 27, which corresponds to an area B (facing the shading part 29) which is not irradiated with light, does not dissolve in a developer.

Moreover, FIG. 7 shows that the shading part 29 has a substantially equal exterior size of that of the area B. However, since light is exposed using a reduced size projection type exposure device, such as a stepper, as the exposure device, actually, the exterior size of the area B is smaller that that of the shading part 29.

Figure 8:
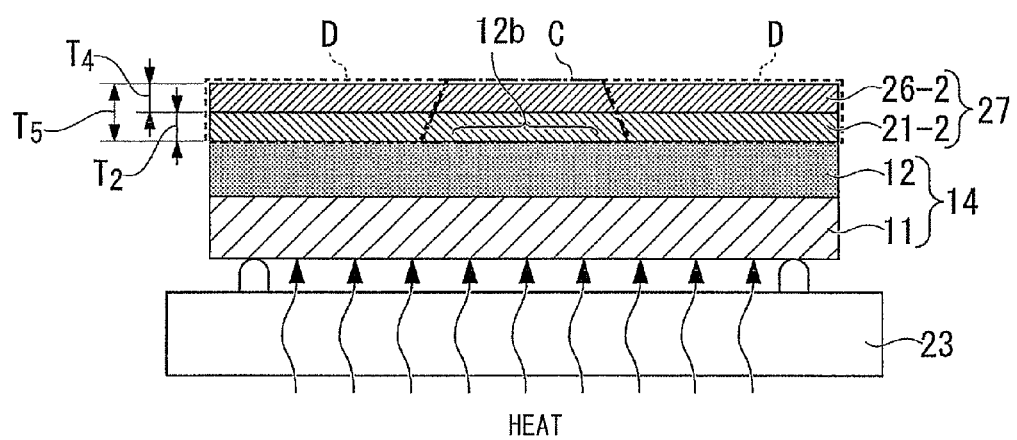
FIG. 8 is another sectional view for explaining the production step for a thick film metal electrode according to the present invention.

Then, in the step shown in FIG. 8, the structure 14 including the thick film resist 27 is arranged on a heater 23, and then, the thick film resist 27 is subjected to a baking treatment (reversal baking treatment) with heat of the heater 23. Thereby, the positive properties of the thick film resist 27 are reversed to negative properties. Specifically, the baking treatment is carried out under conditions in which the heating temperature is 115° C. and the heating time is 120 seconds.

Due to this treatment, the negative type thick film resist 27 has an area C which is formed on and around the electrode formation area 12b, easily dissolved in a developer and has a sectional form having an inverse tapered shape, and an area D other than the area C which is not dissolved in a developer.

Figure 9:
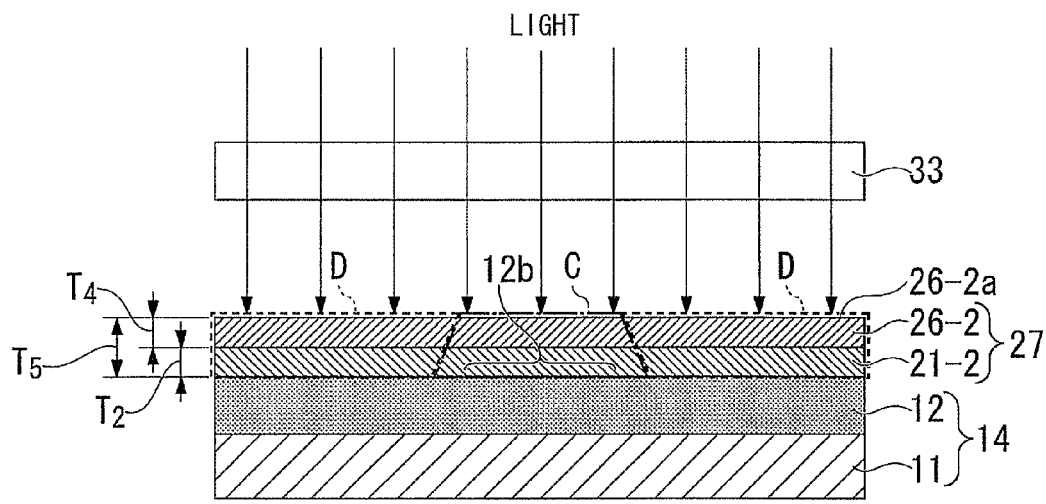
FIG. 9 is another sectional view for explaining the production step for a thick film metal electrode according to the present invention.

Then, in the step shown in FIG. 9, the structure 14 having the negative type thick film resist 27 is fixed on a stage in an exposure device (not shown in FIG. 9).

Then, the thick film resist 27 including the first and second positive-negative reverse type resists 21-2 and 26-2 is exposed through a mask 33 for exposure. The amount of exposure in this step is about ten times the amount of exposure in the step shown in FIG. 7.

When the thickness ($T_5$) of the thick film resist 27 is 7.5 µm, for example, the amount of exposure in the step shown in FIG. 9 is 4,000 mJ/cm$^2$.

Figure 10:
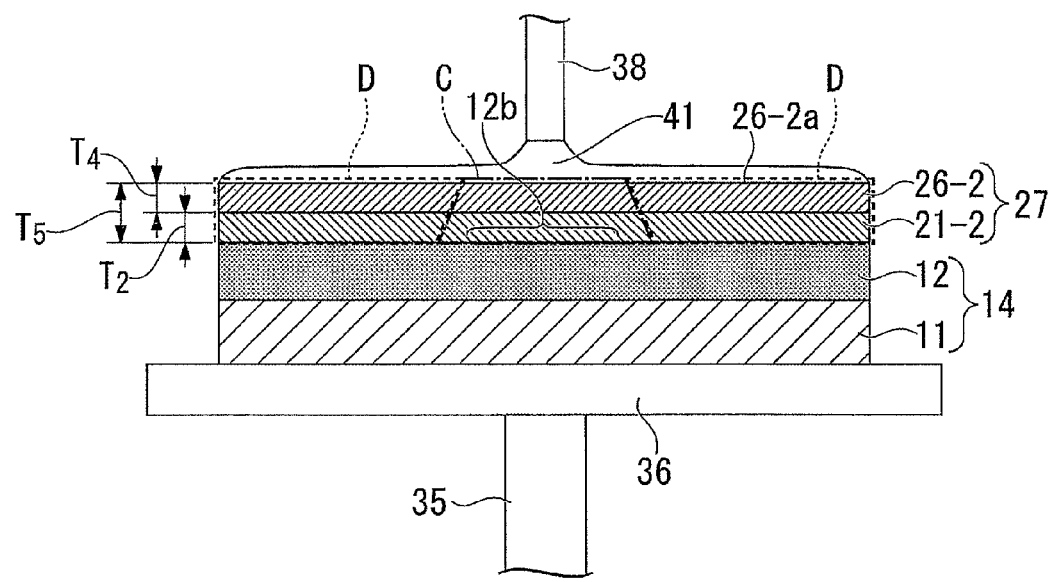
FIG. 10 is another sectional view for explaining the production step for a thick film metal electrode according to the present invention.

In the step shown in FIG. 10, the structure 14 including the thick film resist 27 which is entirely exposed is fixed (for example, by attaching) on a stage 36 having a rotation shaft 35. Then, a developer 41 is dropped from a dispenser 38 toward the upper surface 26-2a of the second positive-negative reverse type resist 26-2. Thereby, the developer 41 is arranged on the upper surface 26-2a of the second positive-negative reverse type resist 26-2 using the surface tension of the developer 41. At this time, the structure 14 is not rotated yet.

Figure 11:
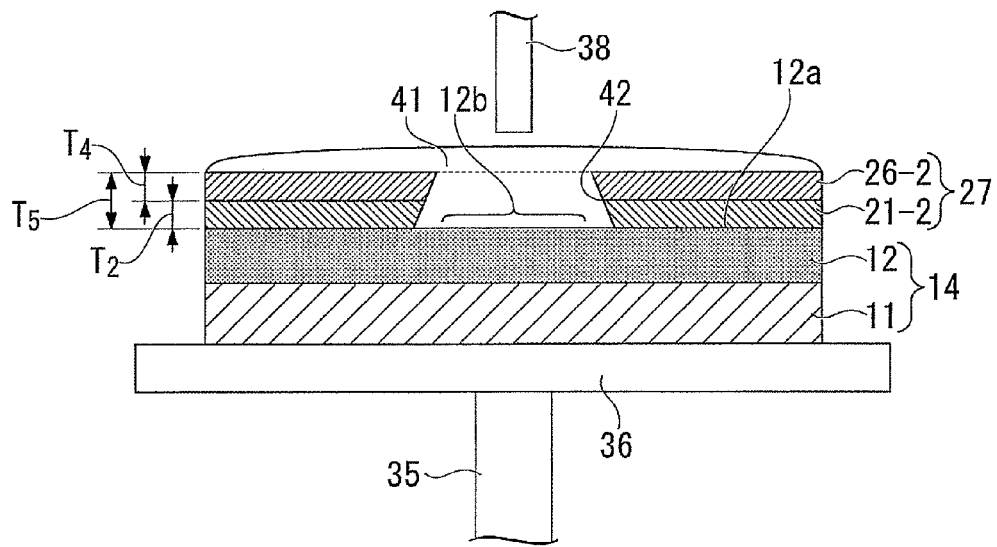
FIG. 11 is another sectional view for explaining the production step for a thick film metal electrode according to the present invention.

Then, in the step shown in FIG. 11, the thick film resist 27 formed on the area C shown in FIG. 10 is dissolved by the developer 41. Due to this, an opening 42, which has a sectional form having an inverse tapered shape and exposes the electrode formation area 12b, is formed. At this time, the structure 14 is not rotated yet.

Figure 12:
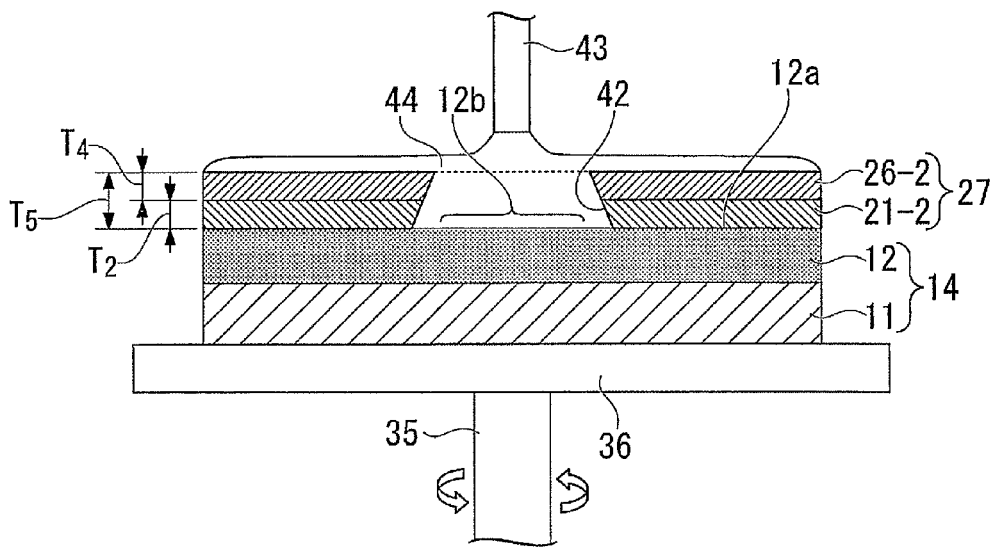
FIG. 12 is another sectional view for explaining the production step for a thick film metal electrode according to the present invention.

Then, in the step shown in FIG. 12, the structure 14 is rotated at a fixed rotation speed while supplying pure water 44 to the upper surface of the structure 14, which has a thick film resist 27 having the opening 42, from a dispenser 43. Thereby, the structure 14 is cleaned.

Figure 13:
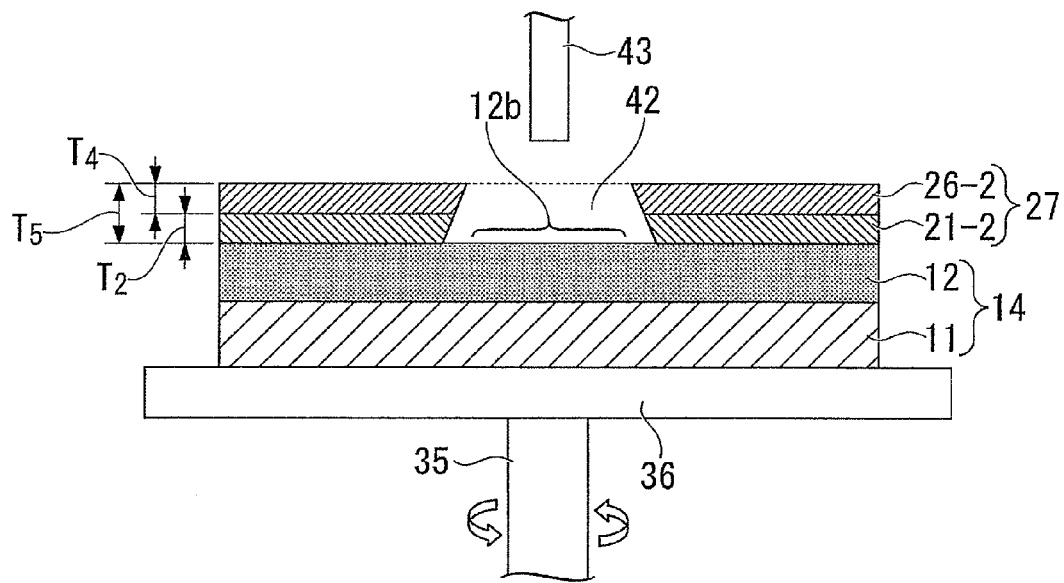
FIG. 13 is another sectional view for explaining the production step for a thick film metal electrode according to the present invention.

In the step shown in FIG. 13, first, the supply of the pure water 44 is stopped. Then, the structure 14 including the thick film resist 27 having the opening 42 is dried by rotating the structure 14 at high rotation speed.

Figure 14:
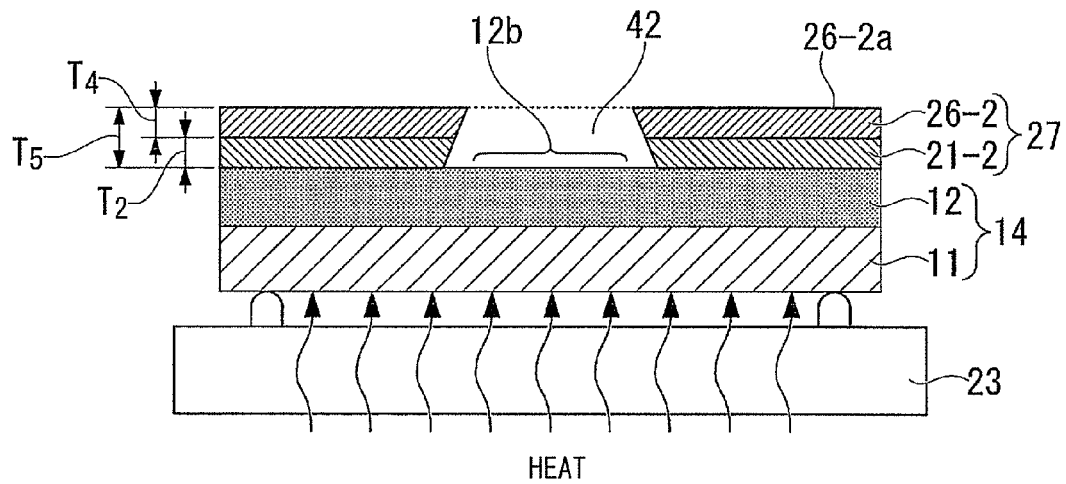
FIG. 14 is another sectional view for explaining the production step for a thick film metal electrode according to the present invention.

In the step shown in FIG. 14, the structure 14 including the thick film resist 27 having the opening 42 is arranged on the heater 23, then the thick film resist 27 is subjected to a post-baking treatment by heat of the heater 23.

Specifically, the post-baking treatment is carried out under conditions in which the heating temperature is 105° C. and the heating time is 60 seconds.

Figure 15:
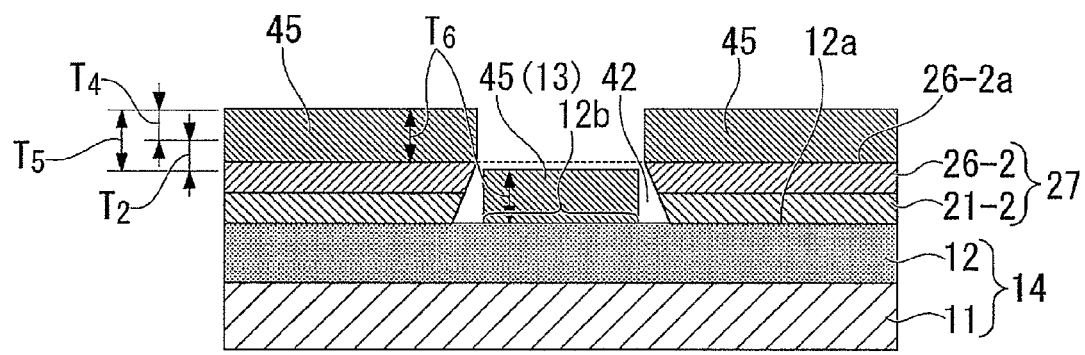
FIG. 15 is another sectional view for explaining the production step for a thick film metal electrode according to the present invention.

In the step shown in FIG. 15, a metal film 45 having a thickness of 6 µm or more, which is a base material for the thick film metal electrode 13, is formed by a vapor deposition method from the upper side of the structure 14 which includes the thick film resist 27 having the opening 47. For example, the metal film 45 may be an aluminum film.

Thereby, the metal film 45 is formed on the upper surface 26-2a of the second positive-negative reverse type resist 26-2 and the electrode formation area 12b. Since the sectional form of the opening 42 is an inverse tapered shaped, the metal film 45 formed on the upper surface 26-2a of the second positive-negative reverse type resist 26-2 and the metal film 45 formed on the electrode formation area 12b are completely separated, and do not contact each other.

Then, in the step shown in FIG. 16, the thick film resist 27 having the metal film 45 is lifted off. Specifically, for example, the thick film resist 27 having the metal film 45 is lifted off by irradiating the structure 14 shown in FIG. 15 with ultrasonic wave while immersing in an organic solvent, such as acetone and isopropyl alcohol (IPA).

By these steps, the silicon carbide device 10, which includes the silicon carbide substrate 11, the circuit element layer 12 formed on the silicon carbide substrate 11, and the thick film metal electrode 13 (electrode pad) which is made from the metal film 45, has a thickness of 6 µm, and is formed at the electrode formation area 12b of the circuit element layer 12, can be produced.

The thick film metal electrode 13 is an electrode pad for external connection to be connected with a metal wire (not shown in figures) by a wire bonding method. In addition, a power device element (not shown in figures) is formed on the circuit element layer 12. The power device element is electronically connected with the thick film metal electrode 13.

Moreover, FIG. 16 shows only one thick film metal electrode 13. In fact, plural thick film metal electrodes 13 are formed on the entirety of the silicon carbide substrate 11 from the outer portion to the center portion. In addition, FIG. 16 shows the thick film metal electrode 13 which is much bigger relative to the silicon carbide electrode 11. Actually, the thick film metal electrode 13 is remarkably small.

According to the production method for the thick film metal electrode according to this embodiment of the present invention, it is possible to form the first positive-negative reverse type resist 21-2 having a uniform thickness and a certain level of thickness, such as 5 µm or more, by forming the first positive-negative reverse type resist 21-1 having the first viscosity on the upper surface 12a of the circuit element layer 12, which is subjected to the HMDS treatment in advance.

In addition, it is also possible to form the second positive-negative reverse type resist 26-2 having a uniform thickness and a certain level of thickness, such as 3 µm or more, by forming the second positive-negative reverse type resist 26-2 having the second viscosity, such as 80 cp or more, which is larger than the first viscosity, on the first positive-negative reverse type resist 21-2.

Thereby, in-plane irregularity (non-uniformity) of the thick film resist 27, which includes the first and second positive-negative reverse type resists 21-2 and 26-2, and has a thickness of 7 µm or more, can be adjusted to a desired range (for example, when the outer circumference of the silicon carbide substrate having a diameter of 3 inches is cut such that the cutting width be 5 mm (edge cutting at 5 mm), the variation of the thickness of the thick film resist formed on the residual center silicon carbide substrate is 5% or less).

In addition, in the production method of this embodiment according to the present invention, the thick film resist 27 is exposed through a mask 31 for exposure including the shading part 29 facing the electrode formation area 12b where the thick film metal electrode 13 is formed, the thick film resist 27 is baked to reverse the positive properties of the thick film resist 27 to the negative properties, the thick film resist 27 is entirely exposed, and the thick film resist 27 is subjected to the development step. Due to these steps, it is possible to expose the electrode formation area 12b and form the opening 42 having a sectional form having an inverse tapered shape in the thick film resist 27 with excellent formability.

In addition, in the production method of this embodiment according to the present invention, after forming the opening 42, the thick film resist 27 is post-baked, a metal film 45 having a thickness ($T_6$) of 6 µm or more, which is a base material for the thick film metal electrode 13, is formed by a vapor deposition method from the side of the upper surface 26-2 of the second positive-negative reverse type resist 26-2, and then the thick film resist 27 is lifted off. Due to these steps, it is possible to produce the thick film metal electrode 13 which has a thickness ($T_6$) of 6 µm or more and has a high formability (the thick film metal electrode 13 has no burring at the edges thereof) in the area of the silicon carbide substrate 11.

In addition, according to the production method for a thick film resist of this embodiment according to the present invention, it is possible to produce a thick film resist 27 having a thickness of 7 µm or more and an in-plane irregularity (non-uniformity on the surface of the silicon carbide substrate) of a desired range (for example, when the outer circumference of the silicon carbide substrate having a diameter of 3 inches is cut such that the cutting width be 5 mm (edge cutting at 5 mm), the variation of the thickness of the thick film resist formed on the resicual center the silicon carbide substrate is 5% or less).

The preferred embodiments of the present invention are explained above. However, the present invention is not limited to these embodiments, and the constitution of the present invention can be changed as long as the change of the constitution is within the scope of the present invention.

For example, the first positive-negative reverse type resist 21-1 having a first viscosity of 30 cp or less is used to form the first positive-negative reverse type resist 21-2 in the above embodiments. However, it is possible to form the first positive-negative reverse type resist 21-2 using a first positive-negative reverse type resist 21-1 having a first viscosity of around 50 cp instead of the first positive-negative reverse type resist 21-1 having a first viscosity of 30 cp or less. In this case, the same effects obtained by the above-mentioned embodiments can also be obtained by this replacement.

In addition, a series of dropping the second positive-negative reverse type resist 26-1 and rotation is carried out just one time to produce the second positive-negative reverse type resist 26-2 having uniform thickness in the above embodiments. However, when the thickness ($T_5$) of the thick film resist 27 is required to be increased, the process in the step shown in FIG. 5 may be repeated several times.

In addition, the silicon carbide substrate 11 having a diameter of 3 inches is used in the above embodiments. However, it is possible to produce a larger silicon carbide substrate 11 having a diameter of more than 3 inches in the present invention. In this case, the same effects obtained by the abovementioned embodiments can also be obtained by this replacement.

Furthermore, the power device is used as one example of the silicon carbide device 10 in the above embodiments. However, the present invention can also be used for high frequency devices and devices used under high temperatures.

EXAMPLES

The present invention and the effects obtained by the present invention will be explained in detail referring to the following Examples. Moreover, the present invention is not limited to the following Examples.

Example 1

First, a silicon carbide substrate 11, which includes a circuit element layer 12 having a power device and has a diameter of 3 inches, was prepared as the structure shown in FIG. 1.

Then, in the step shown in FIG. 2, the upper surface 12a of the circuit element layer 12 was subjected to the HMDS treatment.

In the step shown in FIG. 3, a liquid first positive-negative reverse type resist 21-1 having a first viscosity of 29 cp was dropped on the upper surface 12a of the circuit element layer 12, which had been subjected to the HMDS treatment. Then, the structure 14 was rotated at a fixed rotation speed of 1,200 rpm. Thereby, a first positive-negative reverse type resist 21-1 having a uniform thickness was produced.

Then, in the step shown in FIG. 4, a first positive-negative reverse type resist 21-2 was produced by hardening the liquid first positive-negative reverse type resist 21-1 using a heater 23 at 100° C. for 60 seconds. The thickness ($T_2$) of the first positive-negative reverse type resist 21-1 was 5 μm.

In the step shown in FIG. 5, without the HMDS treatment, a liquid second positive-negative reverse type resist 26-1 having a second viscosity of 85 cp was dropped on the upper surface 21-2a of the first positive-negative reverse type resist 21-2, and the structure 14 was rotated at a rotation speed of 2,500 rpm. Thereby the second positive-negative reverse type resist 26-1 having a uniform thickness was produced.

Then, in the step shown in FIG. 6, the second positive-negative reverse type resist 26-2 was produced by hardening the liquid second positive-negative reverse type resist 26-1 by heating using a heater at 100° C. for 90 seconds. The thickness ($T_4$) of the second positive-negative reverse type resist 26-2 was 3 μm. The thickness ($T_5$) of the thick film resist 27 including the first and second positive-negative reverse type resists 21-2 and 26-2 was 8 μm (which is thicker than 7 μm).

After that, when the outer circumference of the produced structure 14 including the thick film resist 27 was cut such that the cutting width be 5 mm (edge cutting at 5 mm), non-uniformity in-plane of the residual center thick film resist 27 was evaluated. The result was 4.8%, which is less than the objective (5%).

In the subsequent step shown in FIG. 7, the thick film resist 27 including the first and second positive-negative reverse type resists 21-2 and 26-2 was exposed through a mask 31 for exposure using a stepper. The amount of exposure in this step was 55 mJ/cm$^2$.

Then, in the step shown in FIG. 8, the thick film resist 27 was baked using the heater 23 at 115° C. for 120 seconds. Thereby, the positive properties of the first and second positive-negative reverse type resists 21-2 and 26-2 constituting the thick film resist 27 were reversed to negative properties. Due to this, an area C, which is dissolved in a developer 41 and has a sectional form having an inverse tapered shape, was formed.

Then in the step shown in FIG. 9, the entire surface of the thick film resist 27 was exposed. The amount of exposure was 4,000 mJ/cm$^2$.

Then, in the steps shown in FIGS. 10 and 11, the thick film resist 27 in the area C was dissolved by the developer 41 to form an opening 42 having a sectional form having an inverse tapered shape.

Then, in the step shown in FIG. 12, the developer 41 attached to the structure 14 including the thick film resist 27 having the opening 42 was washed away using pure water.

In the step shown in FIG. 13, first, the supplying of the pure water 44 is stopped. Then, the structure 14 including the thick film resist 27 having the opening 42 was dried by rotating the structure 14 at high rotation speed.

In the step shown in FIG. 14, the thick film resist 27 having the opening 42 was subjected to a post-baking treatment by heat of the heater 23 at 105° C. for 60 seconds. At this time, the width of the top of the opening was 1,450 μm square.

In the step shown in FIG. 15, an aluminum film 45 having a thickness ($T_6$) of 6 μm was formed as the metal film 45 by a vapor deposition method from the side of upper surface 26-2a of the second positive-negative reverse type resist 26-2.

Then, in the step shown in FIG. 16, the thick film resist 27 having the metal film 45 was lifted off by irradiating the structure 14 shown in FIG. 15 with ultrasonic wave while immersing in an organic solvent, such as acetone and isopropyl alcohol (IPA).

By these steps, the thick film metal electrode 13 (electrode pad) having a thickness ($T_6$) of 6 μm was formed on the electrode formation area 12b.

Figure 17:
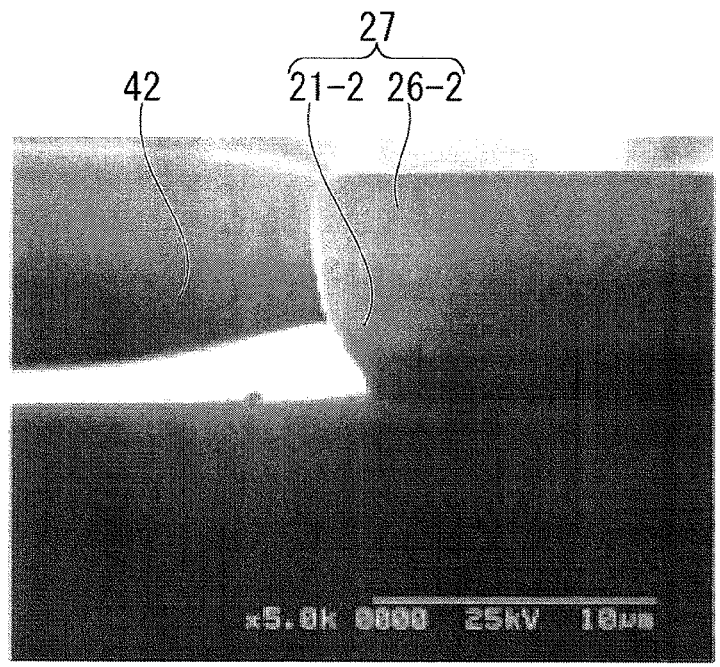
FIG. 17 is a scanning electron microscope photograph for showing a part of an opening formed in the center part of the silicon carbide substrate.
Figure 18:
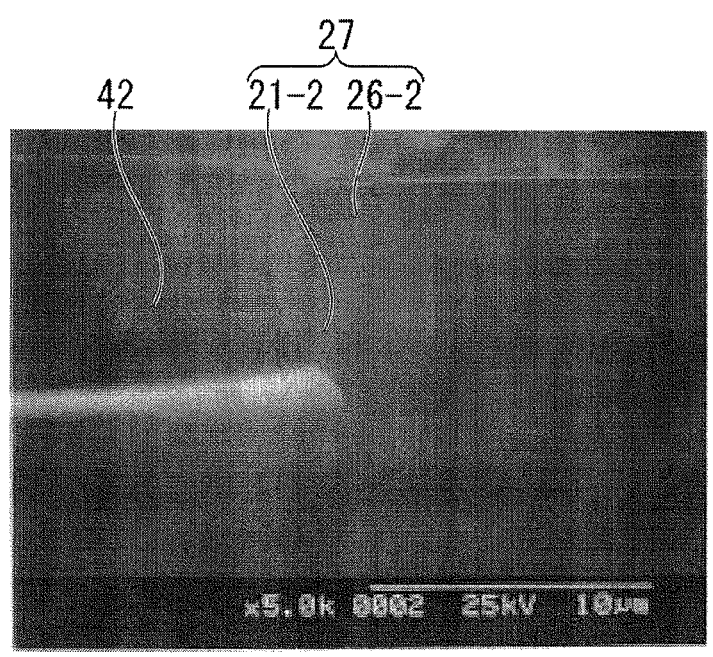
FIG. 18 is another scanning electron microscope photograph for showing a part of an opening formed in the outer part of the silicon carbide substrate.

FIG. 17 is a scanning electron microscope photograph for showing a part of the opening formed in the center part of the silicon carbide substrate. FIG. 18 is another scanning electron microscope photograph for showing a part of an opening formed in the outer part of the silicon carbide substrate. FIGS. 17 and 18 are pictures of the thick film resist 27 after completion of the step shown in FIG. 14.

It was confirmed from FIGS. 17 and 18 that there is little difference in the thickness of the thick film resist 27 formed at the center part and the outer part of the silicon carbide substrate 11.

In addition, there was little difference in the inverse tapered shape of the opening 42 formed at the center part and the outer part of the silicon carbide substrate 11. In other words, it was confirmed that there was little variation in the shape of the opening 42 in the silicon carbide substrate 11.

Figure 19:
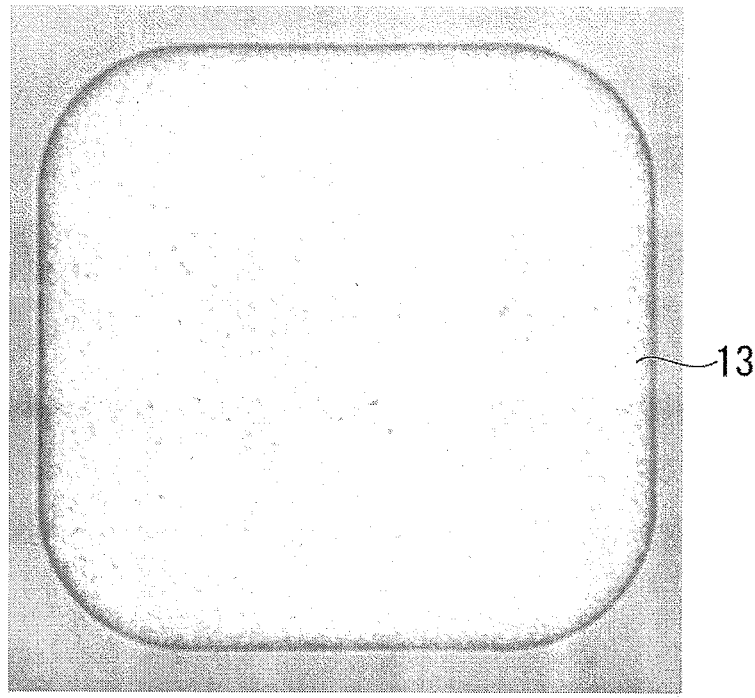
FIG. 19 is an optical microscope photograph for showing a surface of the thick film metal electrode after the step shown in FIG. 16.

FIG. 19 is an optical microscope photograph for showing the surface of the thick film metal electrode after the step shown in FIG. 16.

As shown in FIG. 19, burring was not confirmed at the edge (outer periphery) of the thick film metal electrode 13. In other words, it was confirmed that the thick film metal electrode 13 has a shape having excellent formability.

Based on these results, it was confirmed that according to the production method of the present invention, the in-plane variation (non-uniformity) of the thick film resist 27 having a thickness of 8 μm could be reduced 4.8%, which is less than the target value of 5% or less, and the thick film metal electrode 13 having a thickness of 6 μm and excellent formability (having no burring at the edge) was produced.

What is claimed is:

1. A method for producing a thick film metal electrode having a thickness of 6 μm or more on an upper surface of a circuit element layer formed on a silicon carbide substrate, including:
    a step of treating the upper surface of the circuit element layer with hexamethyldisilazane;
    a step of forming a first positive-negative reverse type resist having a first viscosity on the upper surface of the circuit element layer which is treated with hexamethyldisilazane;
    a step of forming a second positive-negative reverse type resist having a second viscosity, which is larger than the first viscosity, on the first positive-negative reverse type resist such that a total thickness of the first and second positive-negative reverse type resists be 7 μm or more;
    a step of exposing the first and second positive-negative reverse type resists through a mask for exposure including a shading part facing an electrode formation area at which the thick film metal electrode is formed;
    a step of baking the first and second positive-negative reverse type resists to reverse positive properties of the first and second positive-negative reverse type resists to negative properties, after the exposing;
    a step of exposing the whole first and second positive-negative reverse type resists after the baking;
    a step of developing the first and second positive-negative reverse type resists to form an opening, which has a sectional form having an inverse tapered shape and exposes the electrode formation area, after the exposing step for the whole first and second positive-negative reverse type resists;
    a step of post-baking the first and second positive-negative reverse type resists after forming the opening;
    a step of forming a metal film having a thickness of 6 μm or more, which is a base material for the thick film metal electrode by a vapor deposition method from the upper side of the second positive-negative reverse type resist, after the post-baking; and
    a step of lifting the first and second positive-negative reverse type resists off.

2. The method for producing a thick film metal electrode according to claim 1, wherein the first viscosity is 30 cp or less, and the second viscosity is 80 cp or more.

3. The method for producing a thick film metal electrode according to claim 1, wherein the thick film metal electrode is an electrode for external connection to be connected with a metal wire by a wire bonding method.

4. The method for producing a thick film metal electrode according to claim 1, wherein the circuit element layer includes a power device, and the power device is electrically connected with the thick film metal electrode.

5. The method for producing a thick film metal electrode according to claim 1, wherein the step of forming a first positive-negative reverse type resist includes a step of forming the first positive-negative reverse type resist in a liquid state on the upper surface of the circuit element layer, which is treated with hexamethyldisilazane; and a step of pre-baking the first positive-negative reverse type resist in a liquid state to harden the first positive-negative reverse type resist.

6. The method for producing a thick film metal electrode according to claim 5, wherein the thickness of the hardened first positive-negative reverse type resist is 5 μm or less in the step of forming a first positive-negative reverse type resist.

7. The method for producing a thick film metal electrode according to claim 1, wherein the step of forming the second positive-negative reverse type resist includes a step of forming the second positive-negative reverse type resist in a liquid state on a hardened first positive-negative reverse type resist; and a step of pre-baking the second positive-negative reverse type resist in a liquid state to harden the second positive-negative reverse type resist.

8. The method for producing a thick film metal electrode according to claim 7, wherein the thickness of the hardened second positive-negative reverse type resist is 3 μm or more in the step of forming the second positive-negative reverse type resist.

9. A method for producing a thick film resist having a thickness of 7 μm or more on an upper surface of a circuit element layer formed on a silicon carbide substrate including:
    a step of treating the upper surface of the circuit element layer with hexamethyldisilazane;
    a step of forming a first positive-negative reverse type resist having a first viscosity on the upper surface of the circuit element layer which is treated with hexamethyldisilazane; and
    a step of forming a second positive-negative reverse type resist having a second viscosity, which is larger than the first viscosity, on the first positive-negative reverse type resist such that a total thickness of the first and second positive-negative reverse type resists be 7 μm or more.

10. The method for producing a thick film resist according to claim 9, wherein the first viscosity is 30 cp or less, and the second viscosity is 80 cp or more.

11. The method for producing a thick film resist according to claim 9, wherein the method further includes:
    a step of exposing the first and second positive-negative reverse type resists through a mask for exposure including a shading part;
    a step of baking the first and second positive-negative reverse type resists to reverse positive properties of the first and second positive-negative reverse type resists to negative properties, after the exposing;
    a step of exposing the whole first and second positive-negative reverse type resists after the baking; and a step of developing the first and second positive-negative reverse type resists, after the exposing step for the whole first and second positive-negative reverse type resists.

12. The method for producing a thick film resist according to claim 9, wherein the step of forming a first positive-negative reverse type resist includes a step of forming the first positive-negative reverse type resist in a liquid state on the upper surface of the circuit element layer, which is treated with hexamethyldisilazane; and a step of pre-baking the first positive-negative reverse type resist in a liquid state to harden the first positive-negative reverse type resist in a liquid state.

13. The method for producing a thick film resist according to claim 12, wherein the thickness of the hardened first positive-negative reverse type resist is 5 μm or less in the step of forming a first positive-negative reverse type resist.

14. The method for producing a thick film resist according to claim 9, wherein the step of forming the second positive-negative reverse type resist includes a step of forming the second positive-negative reverse type resist in a liquid state on a hardened first positive-negative reverse type resist; and a step of pre-baking the second positive-negative reverse type resist in a liquid state to harden the second positive-negative reverse type resist in a liquid state.

15. The method for producing a thick film resist according to claim 14, wherein the thickness of the hardened second positive-negative reverse type resist is 3 μm or more in the step of forming the second positive-negative reverse type resist.

* * * * *